(12) United States Patent
Matsushima et al.

(10) Patent No.: US 8,709,627 B2
(45) Date of Patent: Apr. 29, 2014

(54) BATTERY TERMINAL WITH CURRENT SENSOR

(75) Inventors: Tomohiro Matsushima, Shimada (JP); Shinichi Hashio, Shimada (JP)

(73) Assignee: Yazaki Corporation, Tokyo (JP)

( * ) Notice: Subject to any disclaimer, the term of this patent is extended or adjusted under 35 U.S.C. 154(b) by 568 days.

(21) Appl. No.: 12/796,105

(22) Filed: Jun. 8, 2010

(65) Prior Publication Data

US 2010/0316901 A1    Dec. 16, 2010

(30) Foreign Application Priority Data

Jun. 10, 2009    (JP) .................................. 2009-139175

(51) Int. Cl.
*H01M 2/26*    (2006.01)

(52) U.S. Cl.
USPC .................. 429/65; 429/61; 429/90; 324/156

(58) Field of Classification Search
USPC ........ 429/121, 178, 61, 90, 65; 439/500, 754, 439/913; 324/156–157
See application file for complete search history.

(56) References Cited

U.S. PATENT DOCUMENTS

| | | | |
|---|---|---|---|
| 7,381,101 B2* | 6/2008 | Roset et al. ..................... | 439/754 |
| 8,035,040 B2* | 10/2011 | Nishikawa ..................... | 174/541 |
| 8,142,237 B2* | 3/2012 | Condamin et al. ............ | 439/762 |
| 8,167,262 B2* | 5/2012 | DeDona et al. ................ | 248/674 |
| 8,237,435 B2* | 8/2012 | Hashio et al. .................. | 324/244 |
| 8,282,275 B2* | 10/2012 | Akaboshi et al. ............. | 374/152 |
| 8,513,950 B2* | 8/2013 | Tanabe .......................... | 324/426 |
| 8,530,069 B2* | 9/2013 | Wood et al. .................... | 429/99 |
| 2002/0051906 A1 | 5/2002 | Wakata et al. | |
| 2005/0008929 A1* | 1/2005 | Brede et al. ..................... | 429/61 |
| 2006/0057899 A1* | 3/2006 | Tokunaga ..................... | 439/754 |
| 2009/0208822 A1* | 8/2009 | Morikawa et al. ............. | 429/61 |
| 2010/0066350 A1* | 3/2010 | Matsumura et al. .......... | 324/120 |
| 2010/0129687 A1* | 5/2010 | Kim ................................. | 429/7 |
| 2011/0024205 A1* | 2/2011 | Nishihara et al. ............ | 180/65.1 |
| 2011/0057622 A1* | 3/2011 | Kim ................................ | 320/137 |
| 2012/0121942 A1* | 5/2012 | Kim ................................. | 429/7 |
| 2012/0141847 A1* | 6/2012 | Amagai et al. ................. | 429/91 |

FOREIGN PATENT DOCUMENTS

| | | |
|---|---|---|
| JP | 2001272422 A | 10/2001 |
| JP | 200250415 A | 2/2002 |
| JP | 2002-141054 A | 5/2002 |

(Continued)

OTHER PUBLICATIONS

Hatsumei Kyokai, Technological Publication No. 2005-505386, Oct. 2006; 8 pages total.

(Continued)

*Primary Examiner* — Joseph S Del Sole
*Assistant Examiner* — Nahida Sultana
(74) *Attorney, Agent, or Firm* — Sughrue Mion, PLLC

(57) ABSTRACT

A battery terminal includes a housing, a bus bar, a first connector, a second connector and a current detector. The housing is made by resin. The bus bar is integrally provided with the housing. The first connector is provided on the bus bar and is adapted to be connected with a battery. The current detector is provided on the bus bar. The second connector is provided on the bus bar. The second connector is adapted to be connected with a harness, and is disposed at a position offset from a straight line passing the first connector and the current detector.

7 Claims, 7 Drawing Sheets

(56) References Cited

FOREIGN PATENT DOCUMENTS

| | | | | |
|---|---|---|---|---|
| JP | 200644443 A | | 2/2006 | |
| JP | 200685945 A | | 3/2006 | |
| WO | WO03057554 | * | 7/2003 | ............... B62M 6/45 |

OTHER PUBLICATIONS

Office Action dispatched Jun. 18, 2013 issued by the Japanese Patent Office in counterpart Japanese Application No. 2009139175.

* cited by examiner ated art shown in FIG. 6 that is disclosed in Patent
BATTERY TERMINAL WITH CURRENT SENSOR

BACKGROUND

The present invention relates to a battery terminal with a current sensor. Particularly, the present invention relates to an improved technique that can allow the battery terminal with a current sensor to be mounted on a vehicle and decrease the weight and cost thereof.

In order to monitor a remaining capacity of a battery, a current sensor is occasionally attached to a battery terminal. For instance, in a battery terminal 500 with a current sensor of a related art shown in FIG. 6 that is disclosed in Patent Document 1, a battery terminal 501 is connected to a harness side terminal 503 by a bus bar 505. The bus bar 505 is made of a long piece shaped electrically conductive metal plate and a current sensor 507 is previously attached to a central part. In one end side of the bus bar 505, a connecting hole (not shown in the drawing) for inserting a bolt 508 of the battery terminal 501 is formed. In the other end side, a bolt 509 for fixing the harness side terminal is fixed by welding so as to be connected to the harness side terminal 503 by a nut 511.

In a bus bar integrally formed current sensor 520 of another related art shown in FIG. 7 that is disclosed in non-Patent Document 1, a battery terminal 521 is connected to a harness side terminal 523 by a bus bar 525. The bus bar 525 is made of a long piece shaped electrically conductive metal plate and a current sensor 527 is previously attached to a central part. In one end side of the bus bar 525, a connecting hole 529 for inserting a bolt 527 of the battery terminal 521 is formed. In the other end side, a bolt 531 for fixing the harness side terminal is fixed by welding so as to be connected to the harness side terminal 523 by a nut 533. In the drawing, the reference numeral 535 designates a nut screwed to the bolt 527. The reference numeral 537 designates a battery post. The reference numeral 539 designates a connector part.

[Patent Document 1] Japanese Patent Publication Number 2002-141054 A
[Non-Patent Document 1] Hatsumei Kyokai Technological Publication Number 2006-505386

In the usual battery terminals 500 and 520 with the current sensors, since connecting parts 541 to the battery terminals 501 and 521, current detecting parts 543 and connecting parts 545 to the harness side terminals 503 and 523 are arranged on a straight line, a problem arises that the sizes of the battery terminals 500 and 520 in a direction of the straight line (a maximum entire length) are increased so that a large attaching space is necessary in an engine room of a vehicle to deteriorate a vehicle mounting property. Further, since the battery terminals 500 and 520 with the current sensors whose maximum entire lengths are increased are overhung from upper faces of batteries under a state that the battery terminals with the current sensors are attached the vehicle, there is a fear that when a force is applied to the connecting parts 545 to the harness side terminals 503 and 523 in end parts, the force is transmitted to the bus bars 505 and 525 to deform and break the bus bars 505 and 525. Further, in an attaching order of the battery terminals 500 and 520 with the current sensors to the vehicle, after the battery terminals 501 and 521 are connected to the battery terminals 500 and 520 with the current sensors, the harness side terminals 503 and 523 are connected thereto. Also in this case, when the harness side terminals 503 and 523 are connected to the battery terminals with the current sensors, a large force is applied to the bus bars 505 and 525. A parts maker may occasionally connect the battery terminals 501 and 521 to the battery terminals with the current sensors and deliver the obtained products to a car maker.

In order to obtain a necessary strength relative to such an external force, the bus bards 505 and 525 need to be enlarged, to increase a thickness for example, so that a weight and cost are increased. Further, the bolts 509 and 531 for connecting the harness side terminals 503 and 523 are attached to the bus bars 505 and 525 by welding or caulking the bus bars 505 and 525. Therefore, attaching processes of the bolts 509 and 531 for fixing the harness side terminals to the bus bars 505 and 525 are necessary, which causes a production cost to be increased.

SUMMARY

It is therefore one advantageous aspect of the present invention to provide a battery terminal with a current sensor that can improve a vehicle mounting property and reduce a weight and cost.

According to one aspect of the invention, there is provided a battery terminal, comprising:
 a housing made by resin;
 a bus bar integrally provided with the housing;
 a first connector provided on the bus bar and configured to be connected with a battery;
 a current detector provided on the bus bar;
 a second connector, provided on the bus bar, configured to be connected with a harness, and disposed at a position offset from a straight line passing the first connector and the current detector.

The battery terminal may be configured such that a wall having a flame shape is provided on the housing between the first connector and the second connector.

The battery terminal may further comprise a magneto-electric conversion element accommodated in a space defined by the wall.

The battery terminal may further comprise a shield, provided on a face of the housing opposite to a face on which the wall is provided, having an attached part inserted into the space defined by the wall.

The battery terminal may be configured such that a resin is filled in the space so as to cover the magneto-electric conversion element and the attached part, so that the shield is fixed with the housing.

The battery terminal may further comprise a connecting member, having a male screw, electrically connected with the bus bar, provided on the second connector integrally with the housing.

The battery terminal may be configured such that a straight line connecting the second connector with the current detector is orthogonal to the straight line passing the first connector and the current detector.

DETAILED DESCRIPTION OF EXEMPLIFIED EMBODIMENTS

Figure 1:
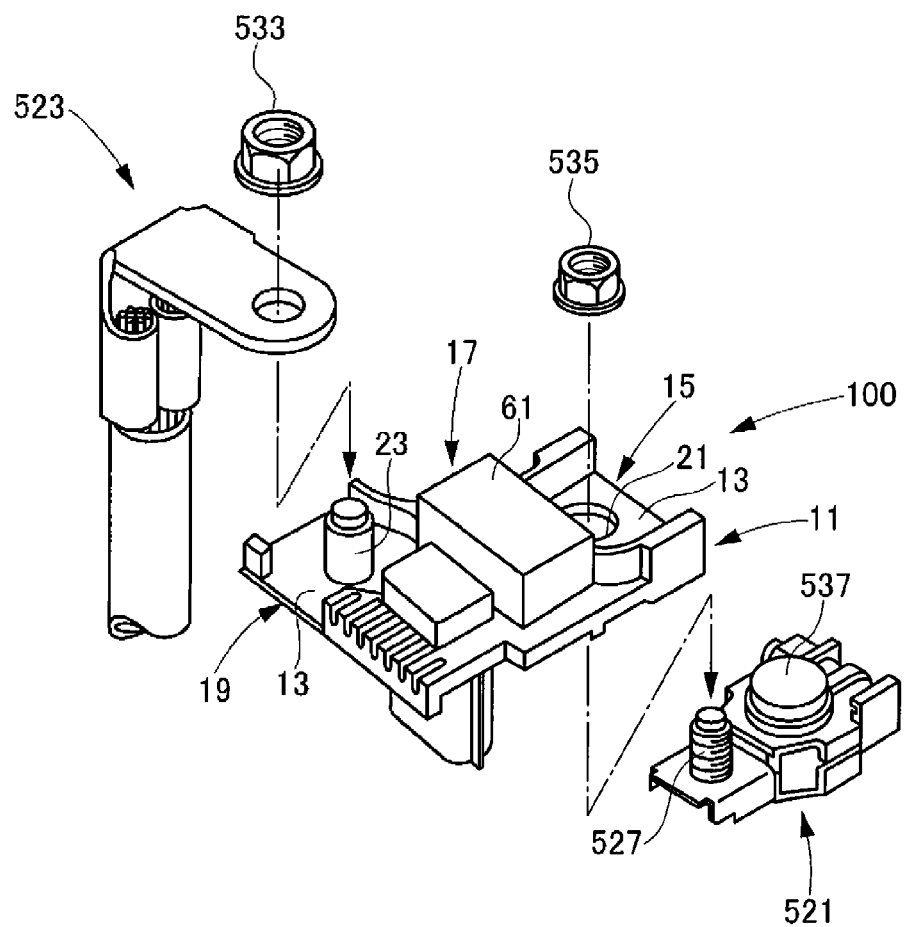
FIG. 1 is an exploded perspective view of a battery terminal with a current sensor according to an embodiment of the present invention.

Now, an embodiment of the present invention will be described below by referring to the drawings.

Figure 6:
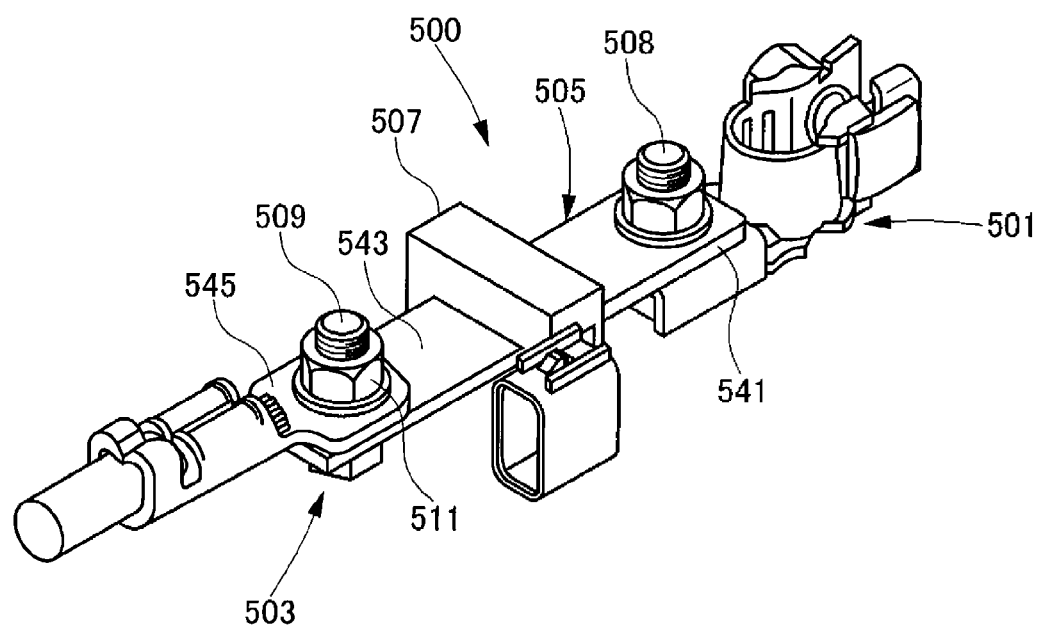
FIG. 6 is a perspective view of a battery terminal with a current sensor according to the related art.
Figure 7:
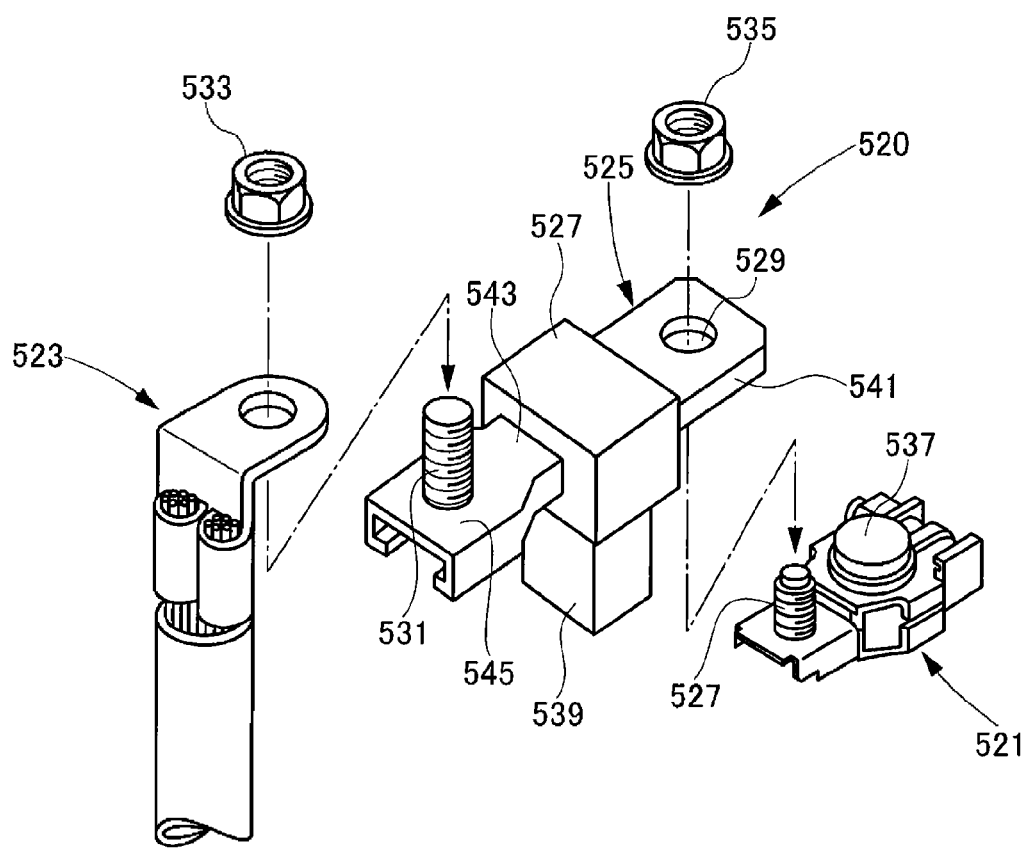
FIG. 7 is an exploded perspective view of a different battery terminal with a current sensor according to the related art.

In FIG. 1, the same members as those shown in FIGS. 6 and 7 are designated by the same reference numerals and a duplicated explanation is omitted.

In the battery terminal 100 with the current sensor according to the embodiment, a bus bar 13 is formed integrally (for instance, insert-molded) with a housing 11 made of a resin and the bus bar 13 is provided so as to be extended to a connecting part 15 to a battery terminal 521, to a current detecting part 17 and to a connecting part 19 to a harness side terminal 523.

The bus bar 13 is inserted into the housing during a molding process of the housing 11 and parts whose strength is necessary are reinforced with a molding resin. Thus, the required strength can be obtained without enlarging the bus bar 13 (increasing a thickness), so that a reduced weight and a low cost can be realized. Since the bus bar 13 in the connecting part 15 to the battery terminal 521 and the connecting part 19 to the harness side terminal 523 is arranged in a part of a metal mold for a resin molding (not shown in the drawing) with which a resin material is not filled, the bus bar is not coveted with the housing 11 and is exposed.

In the bus bar 13 exposed at the connecting part 15 to the battery terminal 521, a bolt hole 21 is formed into which a bolt 527 of the battery terminal 521 is inserted. In the bus bar 13 exposed at the connecting part 19 to the harness side terminal 523, a bolt 23 (a connecting member) for fixing the harness side terminal is provided.

Figure 2A:
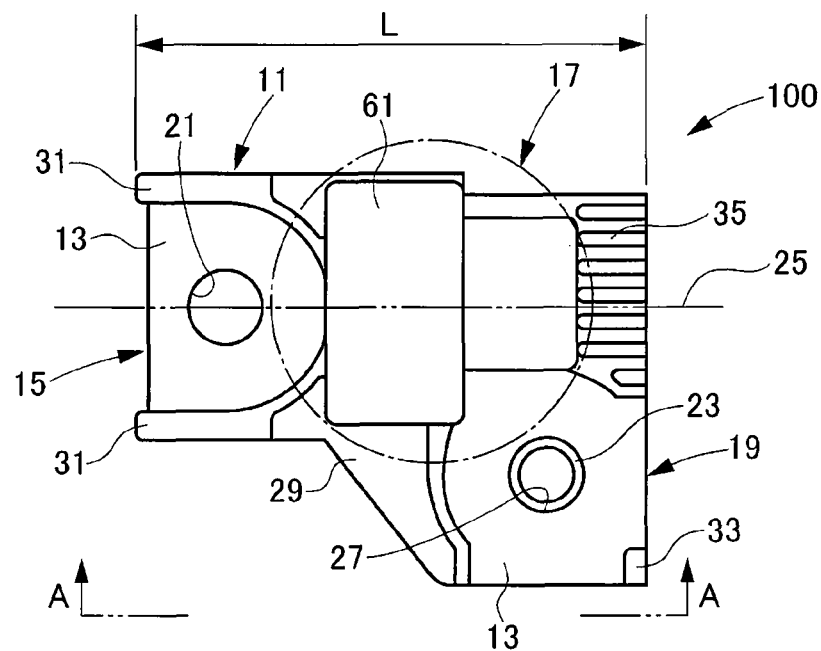
FIG. 2A is a plan view of the battery terminal with the current sensor shown in FIG. 1.

In the battery terminal 100 with the current sensor, the connecting part 19 to the harness side terminal 523 is arranged to be offset from a virtual straight line 25 passing the connecting part 15 to the battery terminal 521 and the current detecting part 17. Namely, in the usual structure, the connecting part 19 located on the virtual straight line 25 opposite to the connecting part 15 with the current detecting part 17 sandwiched between them shifts from the virtual straight line 25 and is arranged in a position forming an L shape. The connecting part 19 shifts from the virtual straight line 25 to be arranged substantially vertically to the current detecting part 17 in FIG. 2A. In other words, a straight line connecting the connecting part 19 with the current detecting part 17 is orthogonal to the virtual straight line 25, so that a maximum entire length L of the battery terminal with the current sensor in the direction of the virtual straight line 25 is more shortened than that of the structures of the related arts.

Figure 2B:
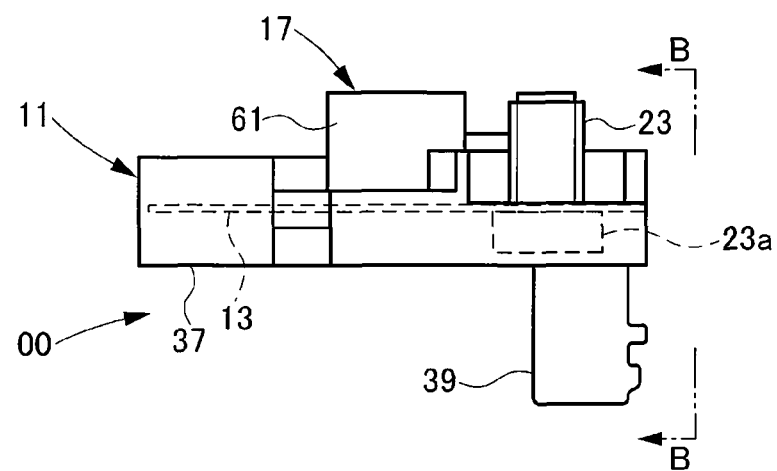
FIG. 2B is a sectional view seen from a line A-A in FIG. 2A.

In the bus bar 13 of the connecting part 19 to the harness side terminal 523, a bolt hole 27 is formed. Into the bolt hole 27, the bolt 23 for fixing the harness side terminal is inserted under pressure from a lower part in FIG. 2B. Namely, the bolt 23 for fixing the harness side terminal is electrically conducted to the bus bar 13 and stands upright in the connecting part 19. In the bolt 23 for fixing the harness side terminal that is inserted into the bolt hole 27 under pressure, its head part 23a is fixed at the same time during the insert molding process. The bolt 23 for fixing the harness side terminal forms the connecting part 19 of the harness side terminal 523 together with the exposed face of the bus bar 13. Thus, a process for connecting the bolt 23 for fixing the harness side terminal to the bus bar 13 which is usually necessary (a welding process or a process for caulking the bus bar 13) can be reduced to lower an assembly cost.

Figure 3:
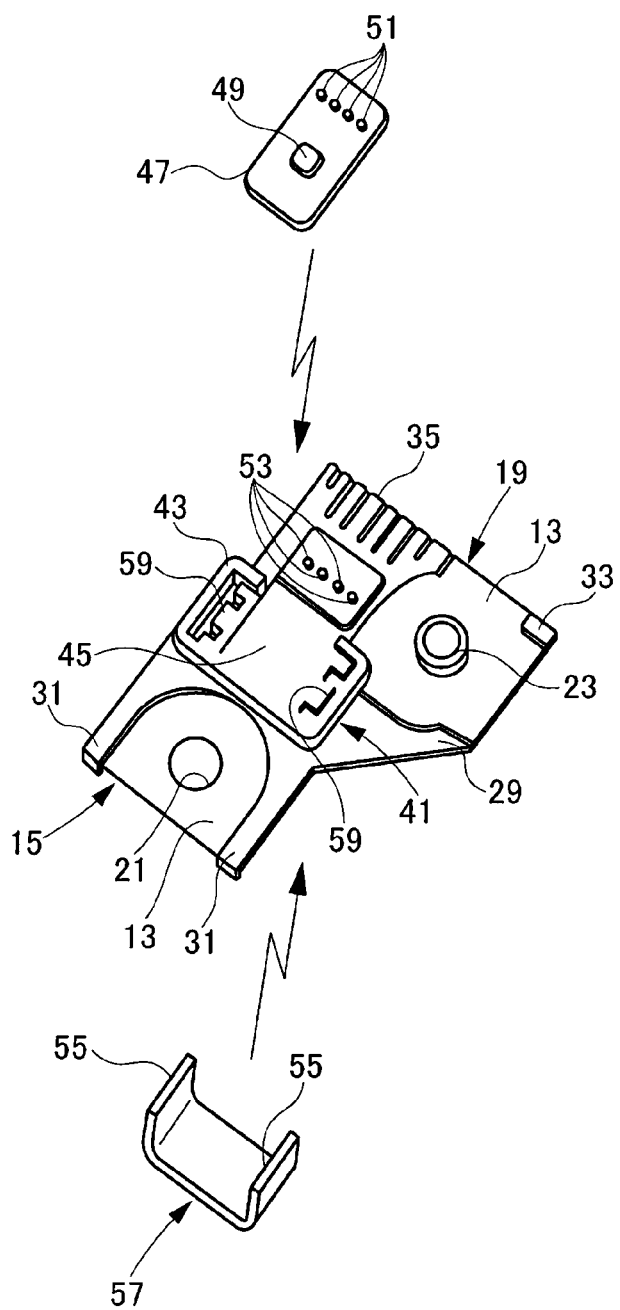
FIG. 3 is an exploded perspective view of a terminal main body according to the embodiment.
Figure 4:
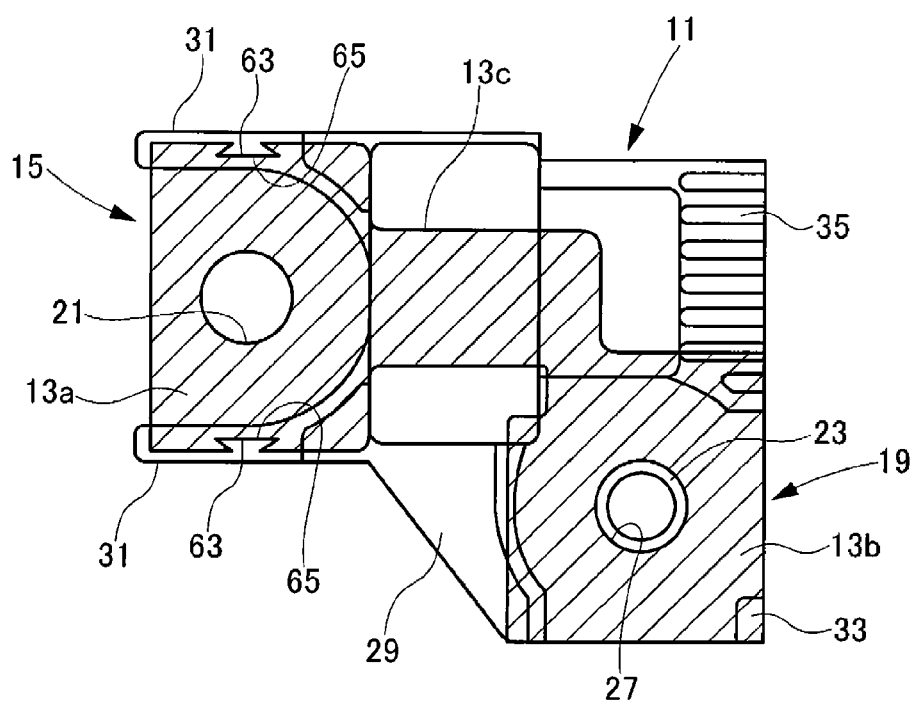
FIG. 4 is a plan view of a housing in which a bus bar according to the embodiment is insert-molded.

In the housing 11, an upper face part 29, a pair of parallel side wall parts 31 and 31, a reinforcing post part 33, a heat radiation fin part 35, a lower face part 37, a connector part 39 and a below-described reinforcing part 41 (see FIG. 3) are integrally formed. These members respectively sandwich the bus bar 13 from upper and lower parts and are integrally formed, so that they contribute to the improvement of the strength of the battery terminal 100 with the current sensor.

In the upper face part 29 of the housing 11, the reinforcing part 41 is formed. The reinforcing part 41 is located between the connecting part 15 of the battery terminal 521 and the connecting part 19 of the harness side terminal 523. The reinforcing part 41 is formed with a rectangular frame shaped peripheral wall 43 formed in the housing 11. Since the peripheral wall 43 is formed in the housing 11, strength to an external bending force applied to both wing parts in the housing that hold the peripheral wall 43 is increased. In an inner space 45 surrounded by the peripheral wall 43, a magneto-electric conversion element 47 is accommodated. The peripheral wall 43 may have a triangular shape, a circular shape, a polygonal shape or any other shape.

The magneto-electric conversion element 47 is formed as a magnetic proportional sensor having, for instance, a Hall element 49. The magneto-electric conversion element 47 detects a magnetic flux generated in accordance with the intensity of a current supplied between the connecting part 15 and the connecting part 19 by the Hall element 49 to detect a charging current or a discharging current. In the magneto-electric conversion element 47, a plurality of terminal holes 51 are provided that are connected to the Hall element 49 by a printed wiring. The terminal holes 51 are connected to a plurality of sensor terminals 53 protruding to the inner space 45. The sensor terminals 53 have the other ends led out as electric contact parts (not shown in the drawing) in the connector part 39. Thus, a detected current is outputted to an external device through the connector part 39.

In the battery terminal 100 with the current sensor, the bus bar 13 is reinforced by the housing 11 whose strength is increased by the peripheral wall 43. Thus, the thickness of the battery terminal 100 with the current sensor can be more reduced. Further, an accommodation structure of the magneto-electric conversion element 47 and the reinforcing part 41 of the bus bar 13 can be commonly used. Thus, the strength of the housing 11 and the entire part of the battery terminal with the current sensor can be improved and the compact form thereof can be realized at the same time.

To a back face (the lower face part 37) of a face (the upper face part 29) of the housing 11 in which the peripheral wall 43 is formed, a shield plate 57 made of metal is attached that has attaching end parts 55 and 55 protruding to the inner space 45 of the peripheral wall 43. In the inner space 45, a pair of slit shaped attaching holes 59 and 59 are formed along a pair of parallel walls of the peripheral wall 43. The attaching end parts 55 and 55 are inserted into the attaching holes 59 and 59 to pass through the lower face part 37 and the upper face part 29 and protrude to the inner space 45.

The shield plate 57 may be provided with engaging pawls (not shown in the drawing) in the attaching end part 55 and 55 and the engaging pawl parts may be engaged with engaging parts (not shown in the drawing) provided in the attaching holes 59 and 59 to regulate a detachment.

Figure 2C:
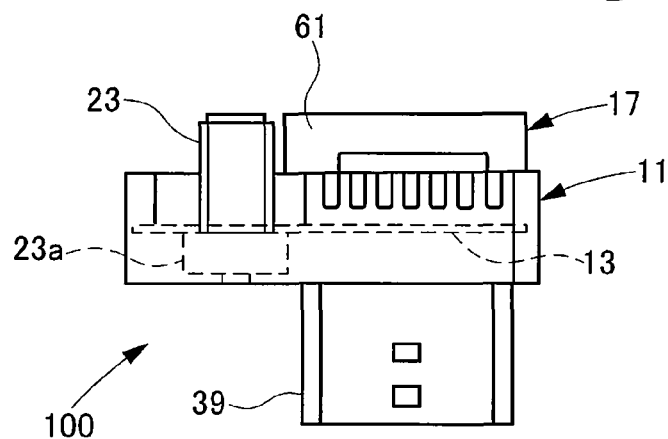
FIG. 2C is a sectional view seen from a line B-B in FIG. 2B.

The inner space 45 in which the magneto-electric conversion element 47 is arranged is filled with a filling resin 61 (see FIGS. 1 and 2) to cover the magneto-electric conversion element 47 therewith. The magneto-electric conversion element 47 is fixed and protected by the filling resin 61. The shield plate 57 has the attaching end part 55 and 55 inserted and buried into the filling resin 61 and is fixed integrally with the housing 11. The filling resin 61 is provided in the inner space 45 of the peripheral wall 43 to bury the magneto-electric conversion element 47. The strength of the reinforcing part 41 is more increased by a block body including the peripheral wall 43 with the solid inner space 45, the magneto-electric conversion element 47 and the filling resin 61 and the shield plate 57 having the attaching end parts 55 and 55 buried into the block body. Thus, the thickness of the bus bar 13 can be more decreased.

In the present embodiment, the inner space 45 is filled with the filling resin 61 to fix and protect the magneto-electric conversion element 47. Otherwise, a structure may be used that the magneto-electric element 47 is fixed by engaging means (not shown in the drawing) such as engaging pawls and protected by a cover (not shown in the drawing).

The bus bar 13 is punched from one electrically conductive metal plate. An exposed face 13a of the connecting part 15 and an exposed face 13b of the connecting part 19 are formed substantially in square configurations. The exposed faces 13a and 13b are connected to each other by a connecting part 13c formed with an equal width immediately below the magneto-electric conversion element 47. In the bus bar 13, for instance, cut-out parts 63 and 63 are formed in both side parts of the exposed face 13a and inner faces of the side wall parts 31 and 31 form engaging protrusions 65 and 65 to be engaged with the cut-out parts 63 and 63 so that a fixing strength to the housing 11 may be increased.

Now, an attaching procedure of the battery terminal 100 with the current sensor having the above-described structure will be described below.

In the battery terminal 100 with the current sensor, the bus bar 13, the sensor terminals 53 and the bolt 23 for fixing the harness side terminal are insert-molded to form the housing 11.

Figure 5A:
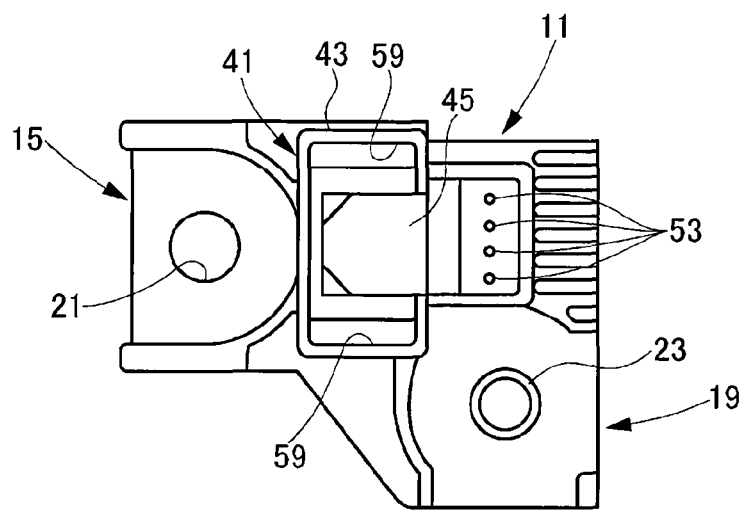
FIGS. 5A to 5C show an attaching procedure of the terminal main body shown in FIG. 3.
Figure 5B:
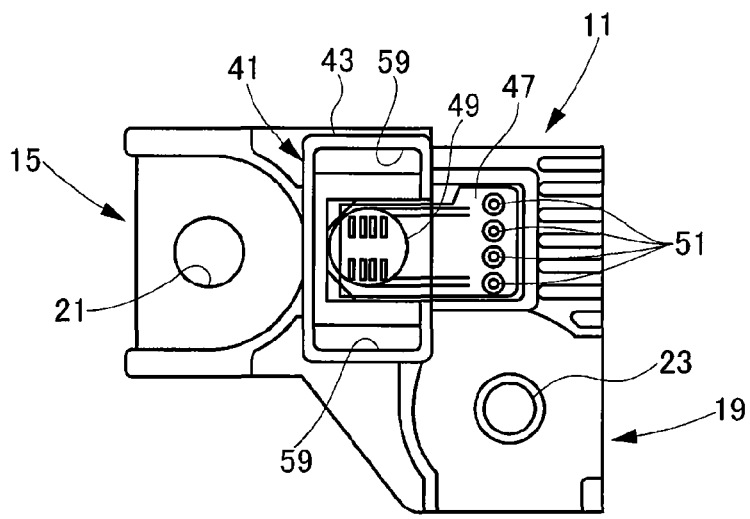

To the housing 11, the magneto-electric conversion element 47 and the shield plate 57 are attached. As shown in FIG. 5A, in the inner space 45 of the housing 11, the sensor terminals 53 are provided upright. As shown in FIG. 5B, the magneto-electric conversion element 47 is attached to the inner space 45 by inserting the terminal holes 51 to the sensor terminals 53.

Figure 5C:
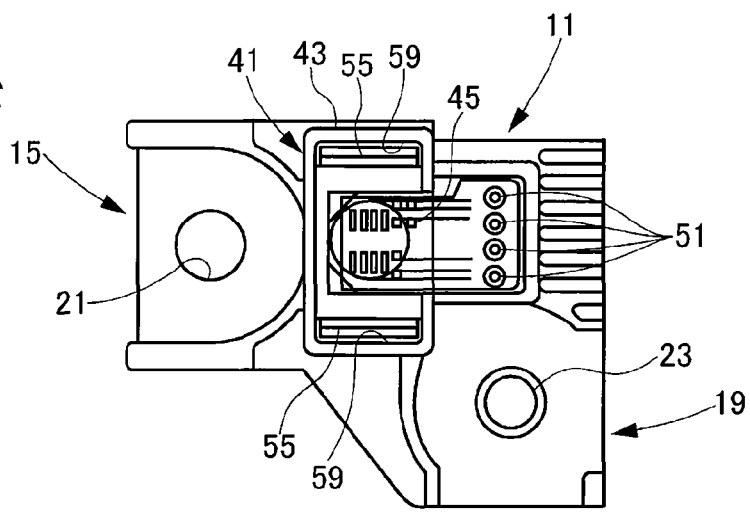

After the magnet-electric conversion element 47 is attached to the inner space 45, as shown in FIG. 5C, the shield plate 57 is attached to the housing by inserting the attaching end parts 55 and 55 into the attaching holes 59 and 59 from the lower face part 37 of the housing 11. After the shield plate 57 is attached to the housing, the inner space 45 of the peripheral wall 43 is filled with the filling resin 61 to cover the magneto-electric conversion element 47 therewith and the attaching end part 55 and 55 of the shield plate 57 are integrally fixed to complete the attaching procedure of a product. To the face of the filling resin 61, an outer cover (not shown in the drawing) may be further attached.

In the battery terminal 100 with the current sensor, the connecting part 19 to the harness side terminal 523 is arranged to deviate from the virtual straight line 25 passing the connecting part 15 to the battery terminal 521 and the current detecting part 17. Thus, the maximum entire length L of the battery terminal 100 with the current sensor can be reduced more by a space where the connecting part 19 to the harness side terminal 523 is arranged on the virtual straight line 25. Accordingly, the dimension of an overhang from the upper face of a battery can be reduced to reduce an attaching space to a vehicle. Further, when the dimension of the overhang is reduced, the bus bar 13 does not need to ensure a high strength so that the thickness of the bus bar 13 may be decreased.

Therefore, according to the battery terminal 100 with the current sensor of the present embodiment, since the connecting part 19 is arranged to be offset from the straight line passing the connecting part 15 and the current detecting part 17, the dimension of the overhang can be reduced to improve the vehicle mounting property. Further, the bus bar 13 can be made to be compact (reduce a thickness) so as to decrease the weight of the entire part of the terminal and the cost can be decreased due to the reduction of a material cost.

Although only some embodiments of the invention have been described in detail above, those skilled in the art will readily appreciated that many modifications are possible in the embodiments without materially departing from the novel teachings and advantages of the invention. Accordingly, all such modifications are intended to be included within the scope of the invention.

The disclosure of Japanese Patent Application No. 2009-139175 filed Jun. 10, 2009 including specification, drawings and claims is incorporated herein by reference in it is entirety.

What is claimed is:

1. A battery terminal, comprising:
   a housing made by resin;
   a single bus bar embedded with the housing, the bus bar having a first connector and a second connector;
   the first connector provided on the bus bar and configured to be connected with a battery;
   a current detector provided on the bus bar;
   the second connector, provided on the bus bar, configured to be connected with a harness, and disposed at a position offset from a straight line passing the first connector and the current detector,
   wherein the first connector and the second connector are provided on the bus bar at a position in which the bus bar is embedded in the housing.

2. The battery terminal as set forth in claim 1, wherein:
   a wall having a flame shape is provided on the housing between the first connector and the second connector.

3. The battery terminal as set forth in claim 2, further comprising:
   a magneto-electric conversion element accommodated in a space defined by the wall.

4. The battery terminal as set forth in claim 3, further comprising:
   a shield, provided on a face of the housing opposite to a face on which the wall is provided, having an attached part inserted into the space defined by the wall,
   wherein a resin is filled in the space so as to cover the magneto-electric conversion element and the attached part, so that the shield is fixed with the housing.

5. The battery terminal as set forth in claim 1, further comprising:
   a connecting member, having a male screw, electrically connected with the bus bar, provided on the second connector integrally with the housing.

6. The battery terminal as set forth in claim 1, wherein:
   a straight line connecting the second connector with the current detector is orthogonal to the straight line passing the first connector and the current detector.

7. The battery terminal as set forth in claim 1, wherein:
the housing includes a projected portion which is disposed at a position offset from the straight line passing the first connector and the current detector, and
the second connector is provided at the projected portion.

* * * * *